United States Patent [19]

Osborn et al.

[11] Patent Number: 5,023,459

[45] Date of Patent: * Jun. 11, 1991

[54] MINIATURE MULTI-TEMPERATURE RADIOMETRIC REFERENCE

[75] Inventors: D. Bruce Osborn, Mission Viejo; Harold R. Bagley, Jr., Irvine, both of Calif.

[73] Assignee: Ford Aerospace & Communications Corporation, Newport Beach, Calif.

[*] Notice: The portion of the term of this patent subsequent to Mar. 11, 2007 has been disclaimed.

[21] Appl. No.: 39,416

[22] Filed: Apr. 17, 1987

[51] Int. Cl.$^5$ ............................................. H01L 25/00
[52] U.S. Cl. .................................. 250/332; 250/495.1; 250/352
[58] Field of Search ............... 250/252.1, 493.1, 494.1, 250/495.1, 504 R, 332, 352; 219/553, 354

[56] References Cited

U.S. PATENT DOCUMENTS

| | | | |
|---|---|---|---|
| 2,952,762 | 9/1960 | Williams et al. | 219/20 |
| 3,077,539 | 2/1963 | Blau, Jr. et al. | 250/493.1 |
| 3,188,473 | 6/1965 | Bates et al. | 250/352 |
| 3,309,881 | 3/1967 | Beerman | 374/2 |
| 3,383,902 | 5/1968 | Cragin et al. | 73/1 |
| 3,604,933 | 9/1971 | Cross et al. | 250/352 X |
| 3,694,624 | 9/1972 | Buchta | 219/358 |
| 3,895,182 | 7/1975 | Trilling | 358/113 |
| 4,063,095 | 12/1977 | Wieder | 250/352 X |
| 4,166,390 | 9/1979 | Benzinger | 250/352 X |
| 4,280,050 | 7/1981 | Callender et al. | 250/330 |
| 4,337,396 | 6/1982 | Lauer et al. | 250/340 |
| 4,378,489 | 3/1983 | Chabinsky et al. | 250/493.1 X |
| 4,387,301 | 6/1983 | Wirick et al. | 250/252.1 |
| 4,419,692 | 12/1983 | Modisette et al. | 250/334 X |
| 4,433,924 | 2/1984 | Quinn, III | 374/2 |
| 4,598,206 | 7/1986 | Nelson | 250/495.1 |
| 4,620,104 | 10/1986 | Nordal et al. | 250/493.1 |

Primary Examiner—Eugene R. LaRoche
Assistant Examiner—Seung Ham
Attorney, Agent, or Firm—Edward J. Radlo; Keith L. Zerschling

[57] ABSTRACT

A miniature multi-temperature radiometric reference is placed in an intermediate image plane (20) of a thermal imaging optical system in order to correct, in a real-time manner, non-uniformities among detectors (30). The radiometric reference comprises at least two reference elements (10) mounted on a thermoelectric cooler (TEC) (1) which may have several stages (6). The reference elements (10) are mounted on the same platform (3) of the TEC (1). Each element (10) has a surface (11), having a substantially uniform temperature, within the depth of focus at the intermediate image plane (20). All of the radiometric reference surfaces (11) are maintained at different temperatures, which can be simultaneously above and below the ambient temperature. This enables determination of a normalized detector response, and subsequent correction of the response of each detector (30) as a function of temperature throughout the range characterized by the temperatures of the reference surfaces (11).

8 Claims, 6 Drawing Sheets

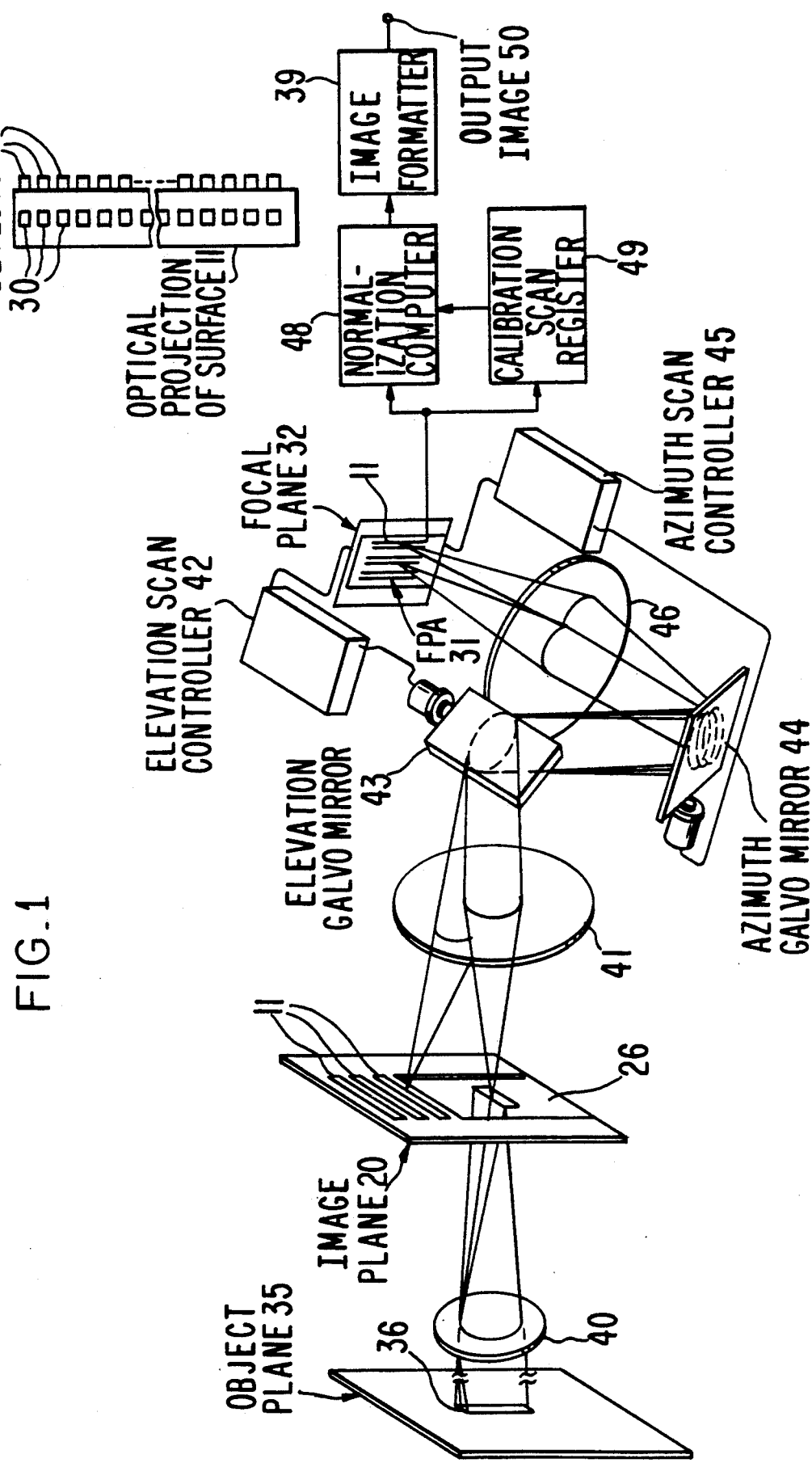

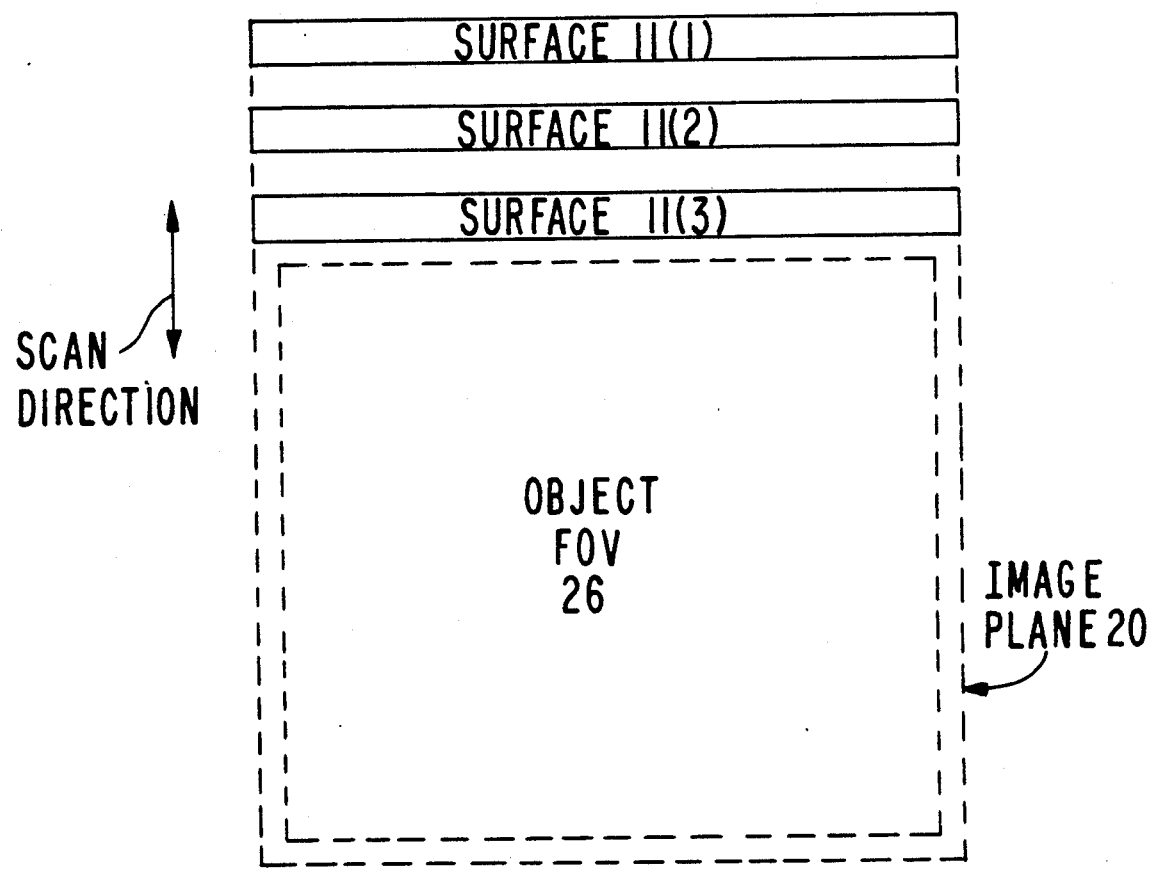

MINIATURE MULTI-TEMPERATURE RADIOMETRIC REFERENCE

DESCRIPTION

1. Technical Field

This invention pertains to the field of correcting detector non-uniformities in a thermal imaging optical system by using radiometric temperature references.

2. Background Art

U.S. Pat. No. 3,309,881 discloses a single temperature blackbody reference including a cascaded thermoelectric unit 10, which provides thermoelectric heating or cooling, with a radiation source 16 mounted on the top stage of unit 10. A temperature-sensitive element 20 is mounted on the radiation source 16 and may be used in a bridge circuit 32 (FIG. 3) to provide a feedback signal to regulate the temperature of the radiation source 16.

The device described in this patent does not suggest the following novel features of the present invention:

1. Simultaneous presentation of several radiometric references having different temperatures.
2. Reference temperatures simultaneously above and below ambient temperature. (Ambient is taken with respect to the internal part of the thermal imaging sensor, as opposed to the detector itself, which is cold.)
3. Each temperature reference is continuous and elongated, enabling calibration of many detectors at once.
4. Miniature size to accommodate location in an image plane.
5. Temperature uniformity of each radiometric reference within a precise preselected temperature range.
6. Means for providing non-uniformity correction of IR (infrared) focal plane array detectors in real-time. The device described in the patent cannot perform real-time correction because it is located external to the normal sensing apparatus.

U.S. Pat. No. 3,694,624 discloses an infrared radiator that includes a thin heating resistance layer 5 connected to a circuit for maintaining the radiator 5 at a constant temperature. FIGS. 1 and 2 depict a ceramic platelet 1 having resistance layer 5 on its front surface and a temperature-measuring layer 3 on its rear surface. Temperature-measuring layer 3 provides a signal to a circuit, shown in FIG. 3, for controlling the power applied to heating resistance layer 5, thereby maintaining a constant temperature of said layer 5.

The device described in this patent does not suggest the following novel features of the present invention:

1. Simultaneous presentation of several radiometric references having different temperatures.
2. Reference temperatures simultaneously above and below ambient temperature. The reference device is used above ambient temperature only.
3. Elongated multi-point temperature reference as opposed to a rectangular block.
4. Miniature size to facilitate location at an image plane.
5. Temperature uniformity across each reference.
6. Means for providing real-time non-uniformity correction of IR detector arrays. In fact, the reference device doesn't perform any correction at all.

U.S. Pat. No. 4,433,924 discloses a single temperature blackbody reference having a thermoelectric unit 32 (FIG. 2) and a temperature sensor 34 including a ceramic substrate for use as a thermal reference.

The device shown in this reference does not suggest the following novel features of the present invention:

1. Simultaneous presentation of several radiometric references having different temperatures.
2. Reference temperatures simultaneously above and below ambient temperature.
3. Miniature size to enable location at an image plane. The patented device requires a flip mirror 18.
4. Stringent temperature uniformity.
5. Means for providing real-time non-uniformity correction of IR focal plane arrays.

Secondary references are U.S. Pat. Nos. 2,952,762; 3,077,539; 3,188,473; 3,383,902; and 4,387,301.

DISCLOSURE OF INVENTION

The present invention is a miniature multi-temperature radiometric reference comprising a thermoelectric cooler (1) having at least one platform (3). Mounted on the same platform (3) are at least two radiometric reference elements (10), each having an exposed surface (11) having a substantially uniform temperature. All points along each surface (11) are made to fall within a preselected temperature range. All of the radiometric reference surfaces (11) are maintained at different temperatures.

BRIEF DESCRIPTION OF THE DRAWINGS

These and other more detailed and specific objects and features of the present invention are more fully disclosed in the following specification, reference being made to the accompanying drawings, in which:

FIG. 1 is a sketch showing a typical imaging optical system in which the present invention can be advantageously employed;

FIG. 2 is a close-up of two columns of detectors 30 from focal plane array 31 of FIG. 1;

FIG. 3 is a front view of image plane 20 of FIG. 1 in a representative embodiment of the present invention in which three radiometric reference surfaces 11 are employed;

BEST MODE FOR CARRYING OUT THE INVENTION

Figure 4:
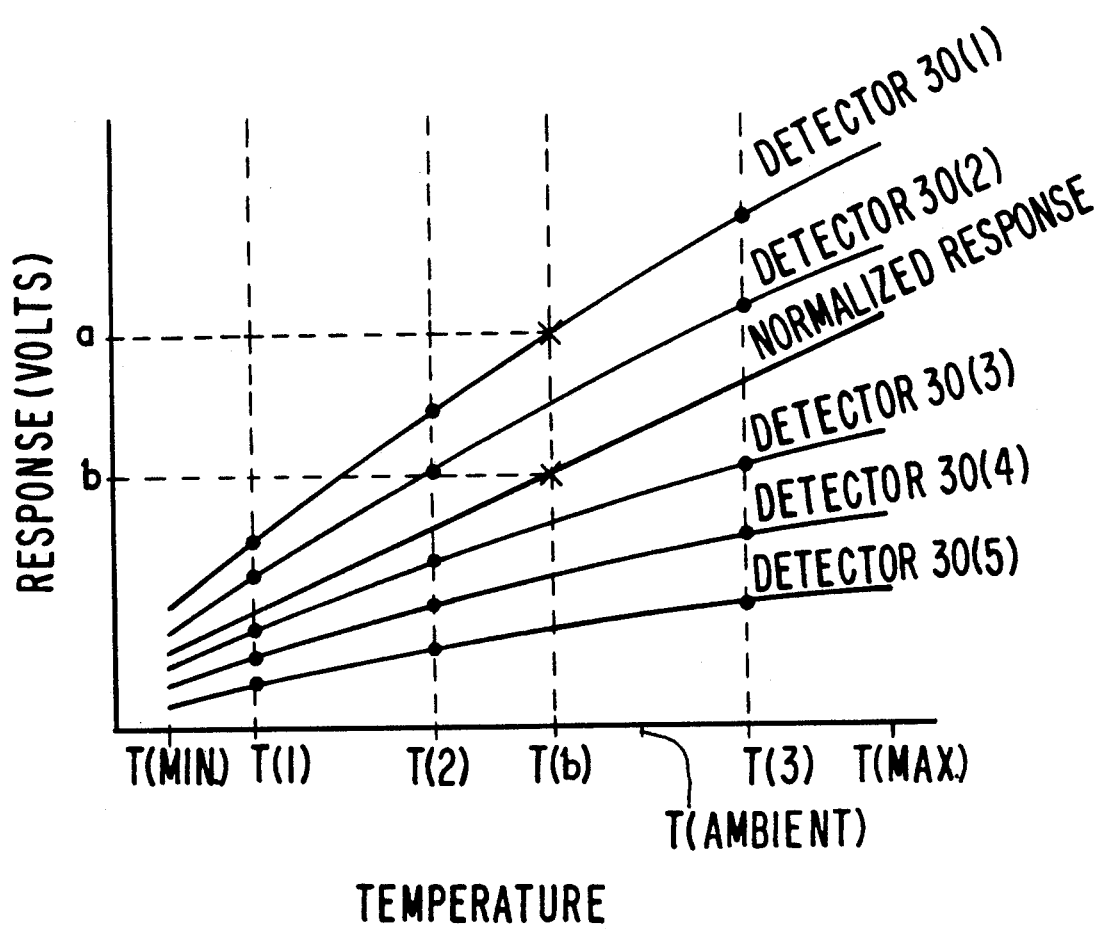
FIG. 4 is a sketch showing the voltage response of five detectors 30 as a function of the three temperatures of the surfaces 11 of FIG. 3.

The purpose of this invention is to provide several radiometric reference surfaces 11, each at different but known, controllable, and very uniform temperatures, at an image plane 20, for correction of infrared detector 30 non-uniformities.

A typical scanning re-imaging optical system which can advantageously use the present invention is illustrated in FIG. 1. An object 36 to be detected lies in an object plane 35 and is focused by entrance lens 40 onto an intermediate image plane 20. Also within the same intermediate image plane 20 are several radiometric reference surfaces 11 of the present invention, and object field of view (FOV) field stop 26, which is typically about ¼" by ¼" square. This image of object 36 is propagated by lenses 41, 46, and mirrors 43, 44 onto the focal plane 32, which contains a focal plane array 31 of individual detector elements 30.

Elevation galvo-controlled mirror 43 normally scans in a sawtooth pattern by means of partially rotating about its shaft, causing relative motion between the optical projection of object 36 and detector array 31. This sawtooth scanning enables the imaging of object 36 by FPA 31.

FPA 31 comprises a set of many detector elements 30 organized into a series of columns. The direction of scan is such that the projection of object 36 is scanned across the columns.

Azimuth galvo-controlled mirror 44 is normally stationary but upon command can partially rotate about its shaft orthogonal to the shaft of mirror 43, causing relative motion between the optical projection of object 36 and FPA 31 in a direction orthogonal to the direction of scan produced by mirror 43.

Scan feedback loops comprising elevation scan controller 42 and azimuth scan controller 45 provide real-time closed-loop dynamic scanning for mirrors 43, 44, respectively.

Detectors 30 provide a thermal image 50 of the scene 36 in the embodiment where detectors 30 are responsive to IR radiation. The grey-scale within image 50 corresponds to the amount of emitted power given off by various points within object 36. Current FPA 31 technology is such that the responses (voltage or current) of detectors 30 as a function of temperature vary from detector to detector, resulting in "streaking" of the final displayed image 50. Thus arises the need to calibrate out detector 30 non-uniformities. According to conventional techniques of the prior art, this is accomplished by scanning detectors 30 over a uniform calibrated radiometric source fixed at a given temperature, and adjusting the detector 30 outputs to provide equal outputs for the given temperature. This can be inadequate for high performance IR imaging sensors, since a scene 36 is usually characterized by a large temperature range, and detector 30 responses can be non-linear with temperature.

Improved sensor performance can be achieved by use of the present invention, which achieves non-uniformity correction of detectors 30 at several temperature calibration points. Surfaces 11 provide two or more uniform and adjustable temperatures. These temperatures can be above and below ambient temperature simultaneously (i.e., within the same scan). The non-uniformity correction can be advantageously done without interrupting the normal operation of the sensor. Radiometric reference elements 10 can be made small enough to be placed at image plane 20, which allows detectors 30 to view them in real-time. This eliminates the need for the opto-mechanical devices of the prior art that interrupt normal operation by inserting the radiometric references into the object FOV 26.

The temperatures of surfaces 11 are individually controllable and can be made extremely uniform typically to within one Noise Equivalent Temperature (NET) (noise component of the detector output signal, i.e., the temperature resolution) over the full imaging field.

FIG. 2 shows two adjacent columns of detectors 30 with the optical projection of one of the radiometric reference surfaces 11 projected thereon. When the optical projection of surface 11 is sufficiently large to cover an entire column of detectors 30 simultaneously, as illustrated, the entire column of detectors 30 can be advantageously compensated simultaneously.

Infrared detectors 30 have three main characteristics which determine their output voltage response: their quantum efficiency, spectral response (including cutoff wavelength), and the temperature emissivity product of the observed object 36. Non-uniformities in the quantum efficiency and spectral cutoff wavelength among detectors 30 lead to dissimilar output voltage responses when the same reference surface 11 temperature is observed, This non-uniformity is corrected by the present invention by modifying the output voltage response of each detector 30 such that when the same temperature is observed, identical voltage responses result for all detectors 30.

The response obtained from the detectors 30 can be thought of as a voltage response or a current response. FIG. 4 shows the case of a voltage response of five detectors 30(1), 30(2), 30(3), 30(4), and 30(5). Typically, three reference temperatures can characterize the temperature region of interest, bounded by T(MIN) and T(MAX). For each of the three radiometric reference temperatures T(1), T(2), and T(3), a voltage is obtained from each of the detectors 30. These data points are shown in graphic form in FIG. 4. Typical reference temperatures are T(1)= −40° C., T(2)= −10° C., and T(3)= +60° C. It is seen that each of the five detectors 30 has a different response with respect to temperature, although each response is generally monotonically increasing with temperature.

The voltage responses of the five detectors 30 resulting from the three reference temperatures shown in FIG. 4 are stored within calibration scan register 49, as often as once per scan of mirror 43 if so desired (many times per second). Normalization computer 48 periodically receives this information from register 49 and generates an approximate actual detector voltage response as a function of temperature, from conventional curve-fitting techniques, such as linear regression analysis. In other words, computer 48 interpolates/extrapolates using the recorded data points to generate a smooth curve for each detector 30 approximating that detector's actual response across the entire temperature range. At this point computer 48 calculates the deviation between the approximated actual response for each detector 30 and the known ideal response that would result from an ideal detector sensing the thermal references 11. Computer 48 uses this deviation information to correct the responses from the detectors 30 as they scan object 36.

For example, assume that detector 30(1) senses a portion of object 36 that is at a temperature of T(b). Detector 30(1) will then output "a" volts into computer 48. Computer 48 normalizes this to "b" volts corresponding to temperature T(b), which is thus the corrected observed temperature. The corrected observed temperatures are periodically fed by computer 48 to image formatter 39, which produces real-time output image 50, by, for example, converting the corrected observed temperatures to grey scale.

In a preferred embodiment of the present invention (FIGS. 7 and 8), several radiometric reference elements 10 are mounted on a single thermoelectric cooler (TEC) 1, which provides primary cooling or heating. TEC 1 allows surfaces 11 to be controllable above or below the ambient temperature of the thermal imaging sensor. Each element 10 comprises a substrate 16 fabricated from a high thermal conductivity material, to ensure temperature uniformity. A uniform, high emissivity coating is applied to the top of substrate 16 to form the radiometric reference surface 11. A heating element 12, e.g., a thin film resistor, is placed onto the bottom surface of each substrate 16, to permit independent electrical heating of each element 10. A thermal insulator 14 is sandwiched between each element 10 and TEC 1 to partially thermally decouple heater 12 from TEC 1. Temperature regulation is provided by feedback control of TEC 1 and heater 12 power, based upon measurements obtained by individual temperature sensors 29, 25. The entire multi-temperature radiometric reference is placed near the edge of object FOV 26 to permit detectors 30 to scan surfaces 11 at the ends of the normal scan during natural overshoot of the scanning mirror 43.

Figure 7:
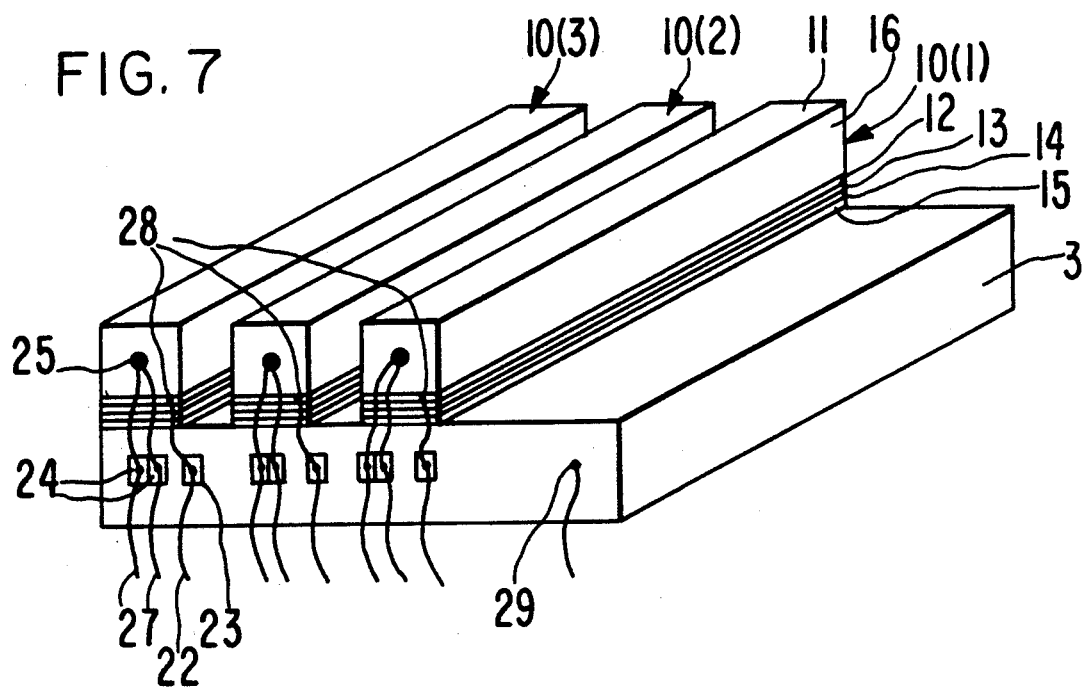
FIG. 7 is an isometric view of an embodiment of the present invention in which three elements 10 are employed on a single thermoelectric cooler platform 3.
Figure 8:
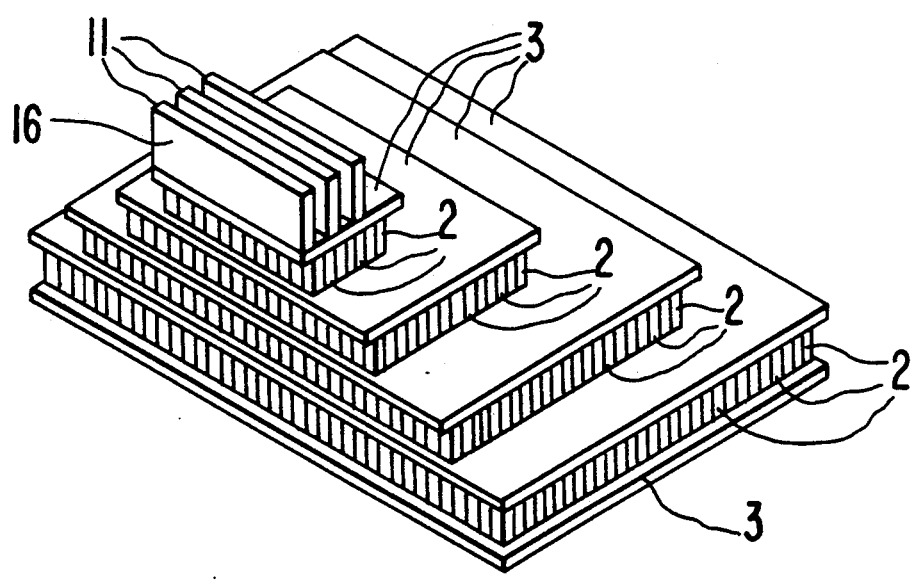
FIG. 8 is an isometric view of the embodiment of FIG. 7 positioned on a thermoelectric cooler 1.

FIG. 7 shows an embodiment of the present invention in which three different reference temperatures T(1), T(2), T(3) are established by mounting three radiometric reference elements 10(1), 10(2), 10(3) on a single TEC 1. Any number of individual reference elements 10 could be used, depending on detector 30 uniformity and dynamic range requirements.

Thermoelectric cooler (TEC) 1 is a solid-state heat pump operating on the Peltier effect. TEC 1 can comprise several stages 6 each comprising a planar high-thermal-conductivity platform 3 (which can be made from the same material as substrate 16) and a matrix of n- and p-type semiconductor elements 2 mounted thereon (see FIG. 5). The "lowermost" (rightmost in FIG. 5) stage 6 has two platforms 3 sandwiching associated elements 2.

Figure 5:
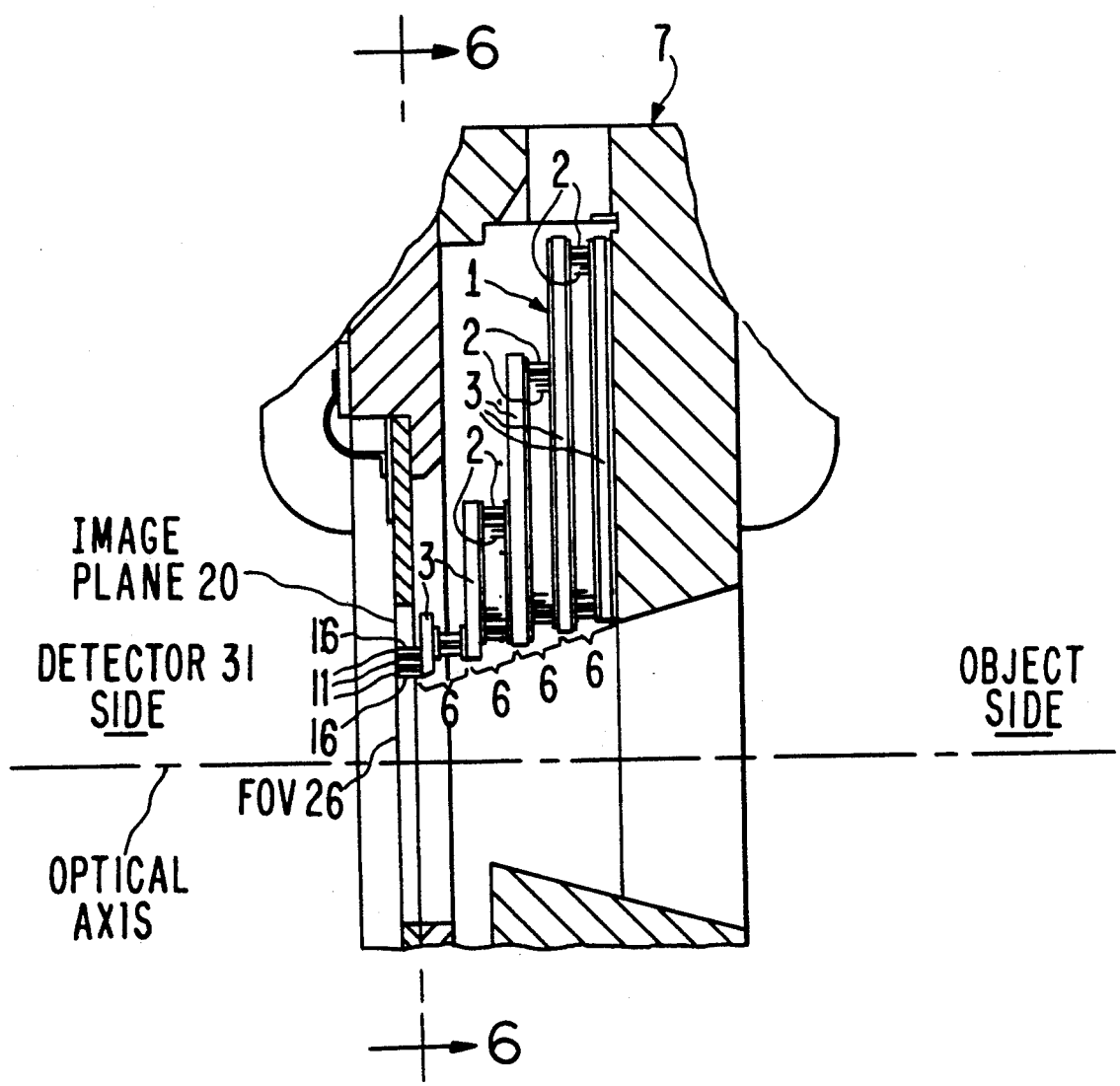
FIG. 5 is a side cross-sectional view showing apparatus 7 capable of positioning the three surfaces 11 of FIG. 3 within the depth of focus at an image plane 20.
Figure 6:
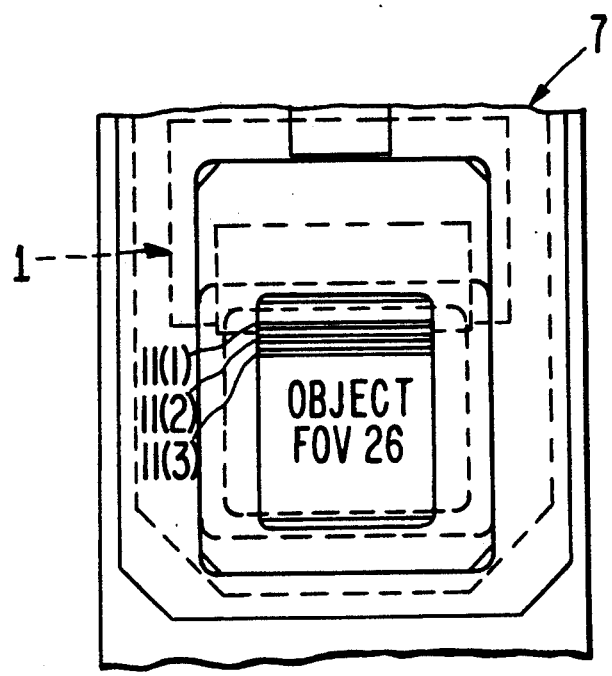
FIG. 6 is a front view of the apparatus of FIG. 5 taken through view lines 6—6.

A custom-built multi-stage TEC 1 is typically required because of geometrical factors such as asymmetric stacking, aspect ratio (ratio of area of smallest stage 6 to area of largest stage 6) and interstage offsets as illustrated in FIGS. 5 and 6 (the profile of TEC 1 is angled to get TEC 1 out of the way of object FOV 26); and the need for optimized performance to achieve the desired temperatures with a small and efficient multi-temperature radiometric reference. Temperature regulation is accomplished by varying the input voltage to TEC 1.

Reference 10(3) may be mounted directly on upper platform 3 of TEC 1, in which case its temperature is regulated by monitoring the temperature of platform 3 via sensor 29, and varying TEC 1 power accordingly. TEC 1 is heated or cooled, depending upon the relative temperatures of element 10(3) and the ambient temperature, by reversing the d.c. current.

Preferably, however, element 10(3), as well as elements 10(1) and 10(2), are partially decoupled thermally from top platform 3 by means of thermal insulation 14, as illustrated in FIG. 7. The three reference surfaces 11 are controlled to three different desired set point temperatures by regulating individual heaters 12 beneath each substrate 16. Substrates 16 are constructed from a high thermal conductivity material to enhance temperature uniformity across surfaces 11. Substrate 16 is typically about 0.5" long by 0.015" wide by 0.05" thick.

Elements 10 require active control to maintain the desired temperature set points. A separate temperature sensor 25 is used for each element 10. Heater 12 power, applied via leads 22 and terminals 28, is regulated to maintain the desired temperatures for surfaces 11. TEC 1 is operated in a coarse temperature control mode, with each heater 12 "fine tuning" the individual surface 11 temperatures to the desired set points.

Temperature sensors 25 must be quite small. If sensor 25 is attached to one end of substrate 16, its size must be less than the width of substrate 16. If sensor 25 is placed underneath substrate 16, it must be smaller than the footprint of substrate 16.

Sensors 25 should satisfy a number of criteria that include miniature size, high sensitivity, minimal self-heating, minimal conduction losses, high accuracy, and long term stability.

Examples of suitable temperature sensors 25 are thermocouples, such as copper-constantan (type T) thermocouples; platinum resistance temperature detectors; and thermistors.

Insulation 14 and heaters 12 are used to elevate surfaces 11 to their desired set point temperatures. The layer of insulation 14 between platform 3 and substrate 16 partially decouples thermally the heated element 10. This achieves the desired temperature without adversely affecting TEC 1 performance by adding an excessive "active" heat load on the top of cooler 1.

Adhesive layer 13 is used between heater 12 and insulation 14, and adhesive layer 15 is used between insulation 14 and platform 3.

A number of approaches for the fabrication of heaters 12 can be used. For example, one approach uses a vapor deposition or sputtering process. This provides a very uniform coating of a resistive metal, such as tantalum nitride or Nichrome, creating a thin-film resistance heater 12.

During metallization of the substrate 16, heater 12 should be made to have excellent uniformity and adhesion around the corners of substrate 16. This is important for electrical continuity and temperature uniformity at the ends of element 10. Likewise, substrate 16 generally requires a low thermal resistance, to achieve temperature uniformity.

Temperature uniformities on the order of 0.01° C. usually require thick slabs (greater than 0.25 inch) of high thermal conductivity material 16 such as copper. When substrate 16 is a metal, electrical insulation is needed to preclude a short circuit between substrate 16 and metallic thin-film resistance heater 12.

The reference surfaces 11 are constructed by applying a high emissivity surface finish onto the thermally conductive substrates 16. This ensures uniform surface 11 temperatues.

Suitable coatings for surfaces 11 include high emissivity paints, anodizing, and vapor deposited coatings. High emissivity paints are preferred in commercially available blackbody references and differential temperature targets.

Leads 22 can be 2 mil platinum wire, bonded with a solder or an electrically conductive epoxy and an epoxy overcoat to strengthen the bond.

The operating environment surrounding the multi-temperature radiometric reference should be moisture free.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A miniature multi-temperature radiometric reference comprising:
   a single thermoelectric cooler having a platform; and
   mounted on the platform, at least two radiometric reference elements each acting as a source of reference radiation and each comprising an exposed extended emissive surface on a thermally conductive substrate, and a heater located between the substrate and the platform; wherein
   each surface has a substantially uniform temperature throughout said surface;
   all points along each surface are controllably maintained within a preselected temperature range;
   all of the surfaces are maintained at different actual temperatures;
   the exposed surfaces of all the radiometric reference elements physically lie in an intermediate image plane of a re-imaging multi-detector optical system for imaging an object; and
   the radiometric reference does not intrude upon the field of view of the object in said intermediate image plane, and therefore does not interfere with the normal imaging operation of said detectors.

2. The radiometric reference of claim 1 further comprising means for scanning an image of the surfaces across the detectors; and
   means for providing real-time non-uniformity correction of the response of the detectors as a function of temperature, without interfering with the normal imaging operation of said detectors; wherein
   the providing means generates a real-time signal indicative of the response of each detector across the temperature range characterized by the temperatures of the element surfaces.

3. The radiometric reference of claim 1 wherein the optical system comprises:
   at least one elongated column of many detectors; and
   means for scanning an image of the surfaces of the elements across the column(s); wherein
   the image of each surface is large enough to cover each column; whereby
   all of the detectors can be normalized simultaneously.

4. The radiometric reference of claim 1 wherein the temperature of at least one of the surfaces is made to be below ambient temperature while simultaneously the temperature of at least one of the surfaces is made to be above ambient temperature.

5. The radiometric reference of claim 1 wherein each heater comprises a thin film resistor located between the platform and the corresponding substrate.

6. The radiometric reference of claim 5 further comprising thermal insulation located between each heater and the platform.

7. A method for correcting, in real-time, non-uniformities among detectors in a thermal imaging optical system having an object plane containing an object to be imaged, a focal plane containing the detectors, and an intermediate image plane located between the object plane and the detecting plane, said method comprising the steps of:
   physically placing in the intermediate image plane a multi-temperature radiometric reference having at least two emissive surfaces mounted on the same platform of a single thermoelectric cooler, each surface having a temperature that is substantially uniform, with all of said surfaces having temperatures that are different from each other;
   scanning an optical projection of the surfaces across the detectors to generate a set of data points indicating the response of each detector as a function of the different surface temperatures;
   calculating from the data points a relationship indicating an approximated actual detector response for each detector as a function of temperature throughout the range characterized by the surface temperatures;
   calculating a set of relationships indicating the deviation of each detector's response from an ideal response as a function of temperature throughout the range characterized by the surface temperature; and
   using said set of relationships indicating the deviation of each detector's response from an ideal response as a function of temperature throughout the range characterized by the surface temperatures to normalize the responses of the detectors as an optical projection of the object is scanned across said detectors.

8. The method of claim 7 wherein each surface covers a first side of a thermally conductive substrate, said substrate having a second side that is thermally coupled to the thermoelectric cooler via a strip heater.

* * * * *